(12) United States Patent
Lee et al.

(10) Patent No.: US 11,610,839 B2
(45) Date of Patent: Mar. 21, 2023

(54) DUMMY FILL STRUCTURES

(71) Applicant: GLOBALFOUNDRIES U.S. INC., Santa Clara, CA (US)

(72) Inventors: Tung-Hsing Lee, Clifton Park, NY (US); Teng-Yin Lin, Clifton Park, NY (US); Frank W. Mont, Troy, NY (US); Edward J. Gordon, Hinesburg, VT (US); Asmaa Elkadi, Essex Junction, VT (US); Alexander Martin, Greenfield Center, NY (US); Won Suk Lee, Malta, NY (US); Anvitha Shampur, Malta, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 670 days.

(21) Appl. No.: 16/666,808

(22) Filed: Oct. 29, 2019

(65) Prior Publication Data

US 2021/0125922 A1  Apr. 29, 2021

(51) Int. Cl.
*H01L 23/522* (2006.01)
*H01L 49/02* (2006.01)
*H01F 27/28* (2006.01)
*H01F 27/24* (2006.01)
*H01F 41/04* (2006.01)

(52) U.S. Cl.
CPC ......... *H01L 23/5227* (2013.01); *H01F 27/24* (2013.01); *H01F 27/2804* (2013.01); *H01F 41/041* (2013.01); *H01L 28/10* (2013.01); *H01F 2027/2809* (2013.01)

(58) Field of Classification Search
CPC . H01L 23/5227; H01L 28/10; H01F 27/2804; H01F 41/041; H01F 2027/2809
See application file for complete search history.

(56) References Cited

U.S. PATENT DOCUMENTS

| | | |
|---|---|---|
| 5,763,955 A | 6/1998 | Findley et al. |
| 5,854,125 A | 12/1998 | Harvey |
| 5,861,647 A | 1/1999 | Zhao et al. |
| 6,066,892 A | 5/2000 | Ding et al. |
| 6,455,393 B1 | 9/2002 | Swanson |
| 7,262,481 B1 | 8/2007 | Marques |
| 7,356,783 B2 | 4/2008 | Smith et al. |
| 7,565,638 B2 | 7/2009 | Hoerold |
| 7,774,726 B2 | 8/2010 | White |
| 9,269,485 B2 * | 2/2016 | Chang ................. H01L 23/5227 |
| 2001/0045616 A1 * | 11/2001 | Yoshitomi ............... H01L 28/10 257/E21.022 |

(Continued)

OTHER PUBLICATIONS

German Office Action related DE Application No. 10 2018 208 451.3 dated Oct. 29, 2018, 8 pages.

*Primary Examiner* — Peniel M Gumedzoe
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to dummy fill structures and methods of manufacture. The structure includes: a passive device formed in interlevel dielectric material; and a plurality of metal dummy fill structures composed of at least one main branch and two extending legs from at least one side of the main branch, the at least two extending legs being positioned and structured to suppress eddy currents of the passive device.

19 Claims, 3 Drawing Sheets

(56) References Cited

U.S. PATENT DOCUMENTS

| | | | |
|---|---|---|---|
| 2005/0016746 A1* | 1/2005 | Sze | H05K 1/0227 174/376 |
| 2009/0207150 A1* | 8/2009 | Obi | G06F 3/046 345/174 |
| 2011/0133308 A1 | 6/2011 | Chan et al. | |

* cited by examiner

DUMMY FILL STRUCTURES

FIELD OF THE INVENTION

The present disclosure relates to semiconductor structures and, more particularly, to dummy fill structures and methods of manufacture.

BACKGROUND

Semiconductor devices are manufactured using several complex processes including, for example, deposition, lithography, etching and planarization processes. Once individual components have been fabricated on a wafer through these complex processes, for example, they are interconnected by metal lines or wires made from conductive material. The metal lines are typically manufactured by depositing layers of metal over the entire surface of the wafer and then precisely etching away areas of the metal, leaving defined metal lines in place. Due to the high density of devices, modern semiconductor devices use multiple metal layers separated by an interlayer dielectric material (ILD).

As process technologies improve, it has become common to build passive devices such as inductors as part of the integrated circuit. In typical integrated circuits, the areas adjacent to the inductor loop are left void of metal and, instead, filled with dielectric material. In some cases, these unused areas present manufacturing issues such as dishing or cupping of the upper layers of the integrated circuit. More specifically, the planarity of topology underlying a deposited layer of material can have a significant impact on the ability to pattern and etch the deposited layer. As the numbers of layers increase and the dimensions of the patterns decrease, the planarity of topology underlying some layers, particularly the interconnect layers, can be significantly affected, resulting in dishing or cupping of the upper layer of the circuit during chemical mechanical planarization (CMP) processes.

SUMMARY

In an aspect of the disclosure, a structure comprises: a passive device formed in interlevel dielectric material; and a plurality of metal dummy fill structures composed of at least one main branch and two extending legs from at least one side of the main branch, the at least two extending legs being positioned and structured to suppress eddy currents of the passive device.

In an aspect of the disclosure, a structure comprises: an inductor with multiple metal windings; and a plurality of metal dummy fill structures composed of extending metal legs from a metal branch, wherein at least the extending metal legs confine and suppress eddy currents of the inductor.

In an aspect of the disclosure, a method comprises: forming a passive device formed in interlevel dielectric material; and forming a plurality of metal dummy fill structures composed of at least one main branch and two extending legs, the at least two extending legs being positioned and structured to suppress eddy currents of the passive device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to dummy fill structures used with passive devices and methods of manufacture. More specifically, the present disclosure is directed to dummy fill structures used with back end of the line (BEOL) passive devices (e.g., inductors, capacitors, etc.) for RF applications. Advantageously, the dummy fill structures described herein suppress induced eddy current and, hence, improve the quality factor of a BEOL passive device, hence leading to higher RF performance, for example. In addition, the dummy fill structures described herein meet chemical mechanical planarization (CMP) density requirements.

The dummy fill structures of the present disclosure can be manufactured in a number of ways using a number of different tools. In general, though, the methodologies and tools are used to form structures with dimensions in the micrometer and nanometer scale. The methodologies, i.e., technologies, employed to manufacture the dummy fill structures of the present disclosure have been adopted from integrated circuit (IC) technology. For example, the structures are built on wafers and are realized in films of material patterned by photolithographic processes on the top of a wafer. In particular, the fabrication of the dummy fill structures uses three basic building blocks: (i) deposition of thin films of material on a substrate, (ii) applying a patterned mask on top of the films by photolithographic imaging, and (iii) etching the films selectively to the mask.

Figure 1:
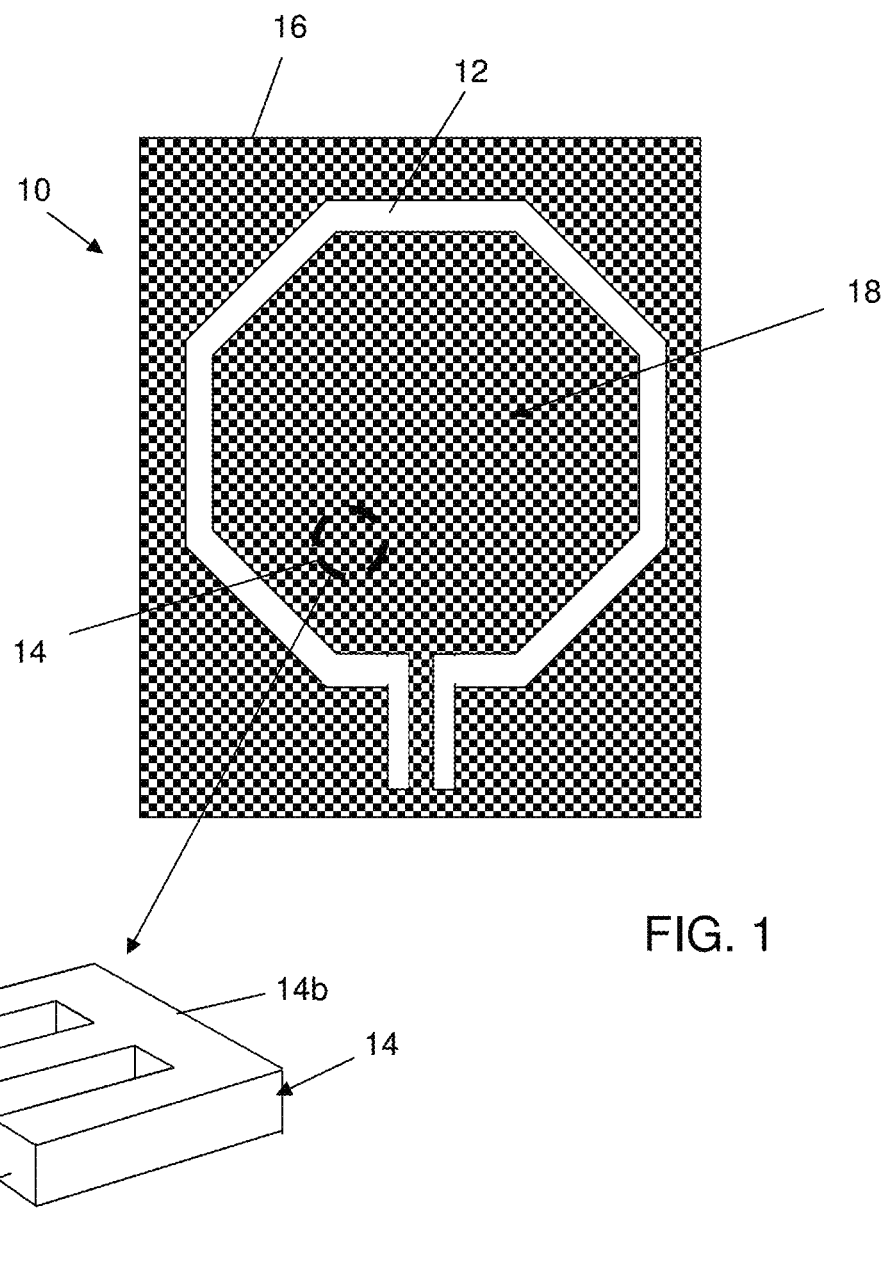
FIG. 1 shows a passive device and dummy fill structures, amongst other features, and respective fabrication processes, in accordance with aspects of the present disclosure.

FIG. 1 shows a passive device and dummy fill structures, amongst other features, in accordance with aspects of the present disclosure. More specifically, the structure 10 of FIG. 1 shows a passive device 12 with dummy fill structures 14 interspersed about the passive device 12. In embodiments, the passive device 12 can be a BEOL passive device such as, e.g., an inductor, transformer or transmission lines. The dummy fill structures 14 are metal dummy fill structures provided within and underneath the confines of the passive device 12. The dummy fill structures 14 will increase the density of the structure 10, hence preventing dishing or cupping that may occur during CMP processes. In addition, the dummy fill structures 14 are configured to reduce or suppress eddy currents as described herein.

More specifically, FIG. 1 illustrates a top view of an inductor 12 and dummy fill structures 14. The inductor 12 can be a looped inductor, but single-ended type inductors, differential inductors, stacked inductors, etc. are also contemplated herein. The inductor 12 (and dummy fill structures 14) is formed in interlevel dielectric layers 16 and can be composed of an inductor wiring pattern with, e.g., multi-turn windings. In illustrative examples, the inductor wiring pattern could be a portion of a transformer or a capacitor. It should also be understood that although the wiring pattern is demonstrated in the form of an octagonal shape, it can also be formed of any other suitable shapes, for example, spiral shape, circular shape, rectangular shape, etc.

Figure 3:
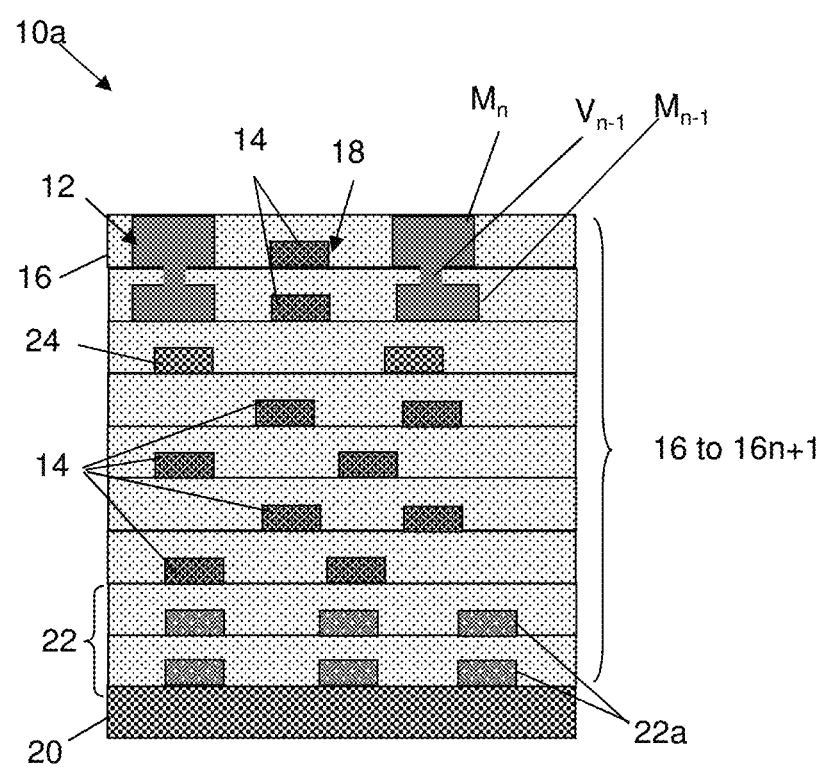
FIG. 3 shows a cross-sectional view of the passive device and dummy fill structures of FIG. 1 and respective fabrication processes in accordance with aspects of the present disclosure.

In embodiments, each winding of the inductor 12 may have a vertical metal stack that includes, in order, metal layer $M_{n-1}$, via plug layer $V_{n-1}$, metal layer $M_n$, etc., as shown in more detail in FIG. 3. The via plug layer $V_{n-1}$ electrically connects the metal layer $M_{n-1}$ to the overlying metal layer $M_n$, while additional via plugs can electrically connect the metal layer $M_n$ to an overlying metal layer. As described with reference to FIG. 3, in embodiments, the inductor 12 is fabricated using conventional deposition, lithography and etching processes as is known to those of skill in the art. For example, the metal layer $M_{n-1}$ may be formed by single damascene methods, while the metal layer $M_n$ and the integral via plug layer $V_{n-1}$ may be formed by dual damascene methods.

Still referring to FIG. 1, a plurality of dummy fill structures 14 is disposed in the interlevel dielectric layers 16. In embodiments, the plurality of dummy fill structures 14 are disposed within an inductor-forming region 18 that is at a same level (e.g., metal layer $M_n$) and/or under (e.g., metal layer $M_{n-1}$) the inductor wiring pattern of the inductor 12. In embodiments, the plurality of dummy fill structures 14 could also be disposed near at least one active device (not shown) such as a MOS transistor, etc. The active device and the inductor wiring pattern could be located in a same or different levels of the device. In any scenario, the plurality of dummy fill structures 14 can be at a same level and under the inductor wiring pattern to help alleviate performance degradation, which may originate from formation of eddy currents, etc.

According to embodiments, the plurality of dummy fill structures 14 can be any appropriate metal or conductive metal provided in a shape that will suppress eddy currents of the inductor 12. For example, the dummy fill structures 14 can be copper or aluminum. In embodiments, the plurality of dummy fill structures 14 occupy at least 15% of a predetermined area under and/or within the inductor wiring pattern of the inductor 12. In more preferred embodiments, the plurality of dummy fill structures 14 occupy about 15% to 20% of a predetermined area under or within the inductor wiring pattern of the inductor 12. It should be understood that the fill density is a balance between process capabilities, i.e., lithography and etching, and inductor performance. For example, the lower the fill density in the inductor, the better performance. The density can also be dependent on technology nodes.

The dummy fill structures 14 are preferably spaced away from the metal wiring of the passive device to prevent any shorting with the passive device, e.g., inductor 12. For example, the dummy fill structures 14 can be spaced away about a few microns from wirings of the inductor 12, depending on the inductor width and field density.

The dummy fill structures 14 can be provided in different configurations, each of which are designed and structured to suppress eddy currents and improve device performance. As shown in FIG. 1, for example, the dummy fill structures 14 include a plurality of conductive (metal) legs 14a extending orthogonal from a conductive (metal) main branch 14b. In this configuration, the plurality of legs 14a and main branch 14b form an "E" shaped structure. It is noted that the "E" shaped structure can be provided in any orientation, e.g., 0° to 360°, with respect to the inductor wirings. The plurality of legs 14a are preferably of the same length and parallel to one another.

It should be recognized by those of skill in the art that the "E" shaped configuration will suppress the eddy currents of the inductor 12, as each opposing leg 14a of the dummy fill structures 14 (and the main branch) will constrain eddy currents within its confines, preventing larger eddy current formation within the inductor 12, itself. For example, fill patterns with a thin metal strip allow eddy current within the fill shape to be divided into several localized flux, with the localized flux cancelling each other out due to geometric constrictions, resulting in a high resistance in high frequency application. This is compared to typical dummy fill structures which are square, round, cylindrical, etc., which do not have the capabilities of constraining eddy currents with extending legs.

Figure 2A:
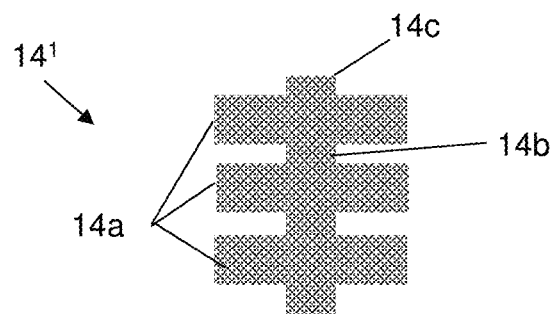
FIGS. 2A-2D show additional configurations of dummy fill structures in accordance with aspects of the present disclosure.

FIGS. 2A-2D show additional configurations of the dummy fill structures in accordance with aspects of the present disclosure. For example, FIG. 2A shows a dummy fill structure $14^1$ comprising a vertically oriented main branch 14b and a plurality of legs 14a orthogonal from the vertically oriented main branch 14b, extending from both sides. That is, in the configuration of FIG. 2A, each of the plurality of legs 14a extend beyond opposing sides of the vertically oriented main branch 14b, with the plurality of legs 14a being parallel to one another and, preferably, at a same length and, in embodiments, evenly spaced apart. The plurality of legs 14a are disposed such that ends 14c of the main branch 14b will extend beyond the upper and lower legs 14a. Although three legs 14a are shown, it should be understood that two or more opposing legs 14a can be used, as each pair of opposing legs 14a (and the main branch 14b) will suppress eddy currents as already described herein. As with each of the dummy fill structures, they can be provided in any orientation, e.g., 0° to 360°, with respect to the inductor wirings.

Figure 2B:
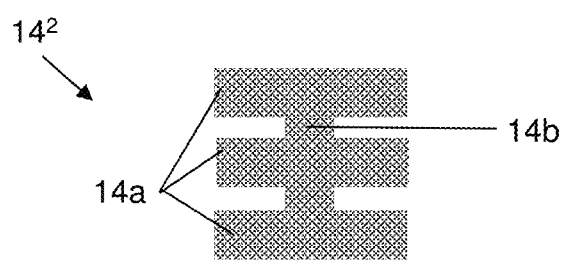

FIG. 2B shows a dummy fill structure $14^2$ similar to that of FIG. 2B. In this configuration, though, the upper and lower legs 14a of the dummy fill structure $14^2$ will extend to the ends of the main branch 14b. In other words, the ends of the main branch 14b are not extending beyond the upper and lower legs 14a. Also, again, although three legs are shown, it should be understood that two or more legs 14a can be used, as each pair of opposing legs 14a (and the main branch 14b) will suppress eddy currents as described herein.

Figure 2C:
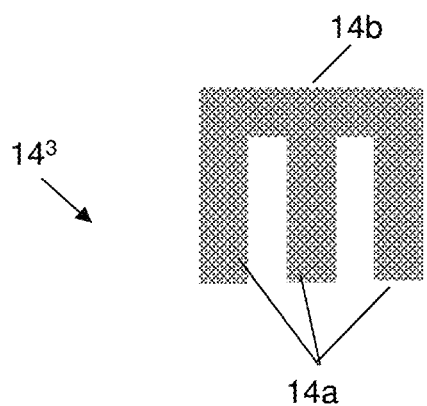

FIG. 2C shows a dummy fill structure $14^3$ similar to that of FIG. 1, but rotated 90 degrees. Again, although three legs are shown, it should be understood that two or more legs 14a can be used, as each pair of opposing legs 14a (and main branch 14b) will suppress eddy currents as described herein.

Figure 2D:
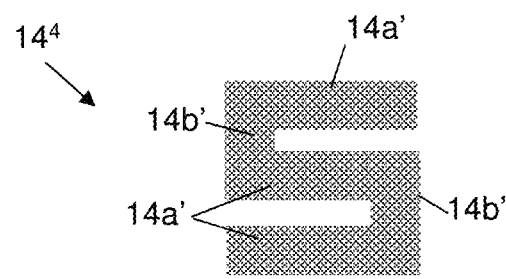

FIG. 2D shows a "S" shaped dummy fill structure $14^4$. In embodiments, each leg 14a' 14b' of the "S" shape is a straight portion, with legs 14a' being orthogonal to legs 14b'. In this configuration, the opposing legs 14a' (and the respective main branch 14b') will suppress eddy currents as described herein. For example, simulations have shown that the dummy fill structures shown in FIGS. 1-2D improve Q-degradation (%), compared to typical dummy fill shapes. Illustratively, the dummy fill structures shown in FIGS. 1 and 2C provide a Q-degradation of 0.10%, compared to a typical structure which has a Q-degradation of 4.74%. Similar performance advantages have also been shown with the dummy fill structures of FIGS. 2A, 2B and 2D.

FIG. 3 shows a cross-sectional view of the passive device and dummy fill structures of FIG. 1 and respective fabrication processes in accordance with aspects of the present disclosure. More specifically, the structure 10a shows a ground shielding layer 20 composed of any shielding material, e.g., metal material. A plurality of successive interlevel dielectric layers 16 to 16n+1 are deposited over the ground shielding layer 20. The interlevel dielectric layers 16 to $16n+1$ can be an oxide based material deposited by conventional deposition methods such as chemical vapor deposition (CVD) processes.

The subsequent layers are metal fill layers 22 composed of metal features 22a. The metal features 22a can be representative of wiring structures or other CMOS devices. The metal features 22a can be formed by conventional lithography, etching and deposition methods known to those of skill in the art. For example, in the case of metal wiring structures, a resist formed over the insulator material 16 is exposed to energy (light) to form a pattern (opening). An etching process with a selective chemistry, e.g., reactive ion etching (RIE), will be used to form one or more trenches in the insulator material 16 through the openings of the resist. The resist can then be removed by a conventional oxygen ashing process or other known stripants. Following the resist removal, conductive material can be deposited by any conventional deposition processes, e.g., chemical vapor deposition (CVD) processes. Any residual material on the surface of the insulator material 16 can be removed by conventional chemical mechanical polishing (CMP) processes.

In the case of CMOS devices, the CMOS devices can be built by additive and subtractive processes known to those of skill in the art such that no further explanation is required for a complete understanding of the structure. For example, the additive and subtractive processes comprise conventional lithography, etching and deposition methods as noted herein. After formation of the CMOS devices, the insulator material 16 can be deposited by CVD processes, as an example, followed by a CMP process.

Still referring to FIG. 3, the dummy fill structures 14 are formed over the metal fill layers 22. The dummy fill structures 14 can be formed in four distinct layers below the inductor 12; although other amount of layers are contemplated herein. The dummy fill structures 14 are formed by conventional lithography, etching and deposition methods known to those of skill in the art as described herein. In embodiments, the dummy fill structures 14 can have a density range of approximately 15% to 20%. The dummy fill structures 14 can also be formed within the inductor-forming region 18 that is at a same level (e.g., metal layer $M_{n-1}$ and metal layer $M_n$) of the inductor wiring pattern of the inductor 12. The pitch between the dummy fill structures 14 can be as small as possible, e.g., minimum design rule.

Still referring to FIG. 3, a fill level with metal features 24 can be fabricated under the inductor 12. The metal features 24 can be any CMOS features and should not be considered a limiting feature. The plurality of dummy fill structures 14 and metal layer $M_{n-1}$ of the inductor 12 are formed in the interlevel dielectric layer above the metal features 24, again using conventional lithography, etching and deposition methods known to those of skill in the art as described herein. The dummy fill structures 14 will be formed within the confines or inductor-forming region 18 of the inductor at the same level as the metal layer $M_{n-1}$ of the inductor 12. These features can be formed by a single damascene process. Additional dummy fill structures 14 are formed within an inductor-forming region 18 that is at a same level as, e.g., metal layer $M_n$. In embodiments, the metal layer $M_n$ and the via $V_{n-1}$, which connects the metal layers $M_n$ and $M_{n-1}$, may be formed by dual damascene methods or separate single damascene methods.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a passive device formed in interlevel dielectric material; and
   a plurality of metal dummy fill structures composed of at least one main branch and two extending legs from at least one side of the main branch, the at least two extending legs being positioned and structured to suppress eddy currents of the passive device, the plurality of metal dummy fill structures provided at least at a same level and underneath of the passive device within the interlevel dielectric material.

2. The structure of claim 1, wherein the plurality of metal dummy fill structures are provided within an inductor-forming region of the passive device.

3. The structure of claim 1, wherein the plurality of metal dummy fill structures are provided below and within an inductor-forming region of the passive device.

4. The structure of claim 1, wherein the passive device is an inductor.

5. The structure of claim 1, wherein the plurality of metal dummy fill structures are configured in an "E" shape.

6. The structure of claim 1, wherein the plurality of metal dummy fill structures are configured in a "S" shape with each leg of the "S" shape being a straight portion parallel and/or orthogonally located with respect to one another.

7. The structure of claim 1, wherein the at least one main branch is a vertically oriented main branch and the at least two extending legs are orthogonal from the vertically oriented main branch, extending from opposite sides of the vertically oriented main branch.

8. The structure of claim 7, wherein the vertically oriented main branch includes ends extending beyond an upper leg and lower leg of the of least two extending legs.

9. The structure of claim 1, wherein the at least one main branch is vertically oriented with respect to pairs of opposing legs extending from the at least one main branch.

10. The structure of claim 1, wherein the plurality of metal dummy fill structures occupy a predetermined area of an integrated circuit under and/or within a wiring pattern of the passive device.

11. The structure of claim 1, wherein the plurality of metal dummy fill structures comprises at least three legs extending outward from at least one side of the at least one main branch.

12. A structure comprising:
an inductor with multiple metal windings; and
a plurality of metal dummy fill structures composed of extending metal legs from a metal branch, wherein at least the extending metal legs confine and suppress eddy currents of the inductor and the plurality of metal dummy fill structures are provided below the inductor wherein the plurality of metal dummy fill structures occupy about 15% to 20% of a predetermined area of an integrated circuit under and/or within a wiring pattern of the multiple metal windings.

13. The structure of claim 12, wherein the plurality of metal dummy fill structures are within an inductor-forming region.

14. The structure of claim 12, wherein the plurality of metal dummy fill structures are configured in an "E" shape.

15. The structure of claim 12, wherein the plurality of metal dummy fill structures are configured in a "S" shape with each leg of the "S" shape is a straight portion parallel and/or orthogonal with respect to one another.

16. The structure of claim 12, wherein the plurality of metal dummy fill structures each comprise a vertically oriented main branch and a plurality of legs orthogonal from the vertically oriented main branch, the plurality of legs extending from opposite sides of the vertically oriented main branch.

17. The structure of claim 12, wherein the plurality of metal dummy fill structures comprises at least three legs extending outward from at least one side of the at least one main branch.

18. A method, comprising:
forming a passive device formed in interlevel dielectric material; and
forming a plurality of metal dummy fill structures composed of at least one main branch and two extending legs, the at least two extending legs being positioned and structured to suppress eddy currents of the passive device, the plurality of metal dummy fill structures formed at least at a same level and underneath of the passive device within the interlevel dielectric material.

19. The structure of claim 1, wherein, at a same level of the interlevel dielectric material, the plurality of metal dummy fill structures partially extend within a height of the interlevel dielectric material and the passive device extends from a bottom surface to a top surface the interlevel dielectric material.

\* \* \* \* \*